United States Patent [19]

Petric et al.

[11] Patent Number: 4,560,880

[45] Date of Patent: * Dec. 24, 1985

[54] APPARATUS FOR POSITIONING A WORKPIECE IN A LOCALIZED VACUUM PROCESSING SYSTEM

[75] Inventors: Paul F. Petric, Swampscott; Michael S. Foley, Beverly; John J. Waz, Ipswich; Robert W. Milgate, III, Marblehead, all of Mass.

[73] Assignee: Varian Associates, Inc., Palo Alto, Calif.

[*] Notice: The portion of the term of this patent subsequent to Jul. 9, 2002 has been disclaimed.

[21] Appl. No.: 533,823

[22] Filed: Sep. 19, 1983

[51] Int. Cl.[4] .............. H01J 37/18; H01J 37/20; H01J 33/02

[52] U.S. Cl. ............... 250/441.1; 250/442.1; 250/492.2; 219/121 EN; 219/121 EQ; 219/121 EX; 219/121 EY

[58] Field of Search .......... 250/441.1, 442.1, 492.2; 219/121 EN, 121 EQ, 121 EX, 121 EY

[56] References Cited

U.S. PATENT DOCUMENTS

| 4,191,385 | 3/1980 | Fox .......................................... 277/3 |
| 4,342,900 | 8/1982 | Susei et al. ................... 219/121 EN |
| 4,344,160 | 8/1982 | Gabriel et al. ........................ 367/96 |
| 4,358,657 | 11/1982 | Steigerwald et al. ........ 219/121 EN |

FOREIGN PATENT DOCUMENTS

| 0106511 | 4/1984 | European Pat. Off. |
| 1153770 | 5/1969 | United Kingdom . |
| 1160704 | 8/1969 | United Kingdom . |
| 2023336A | 12/1979 | United Kingdom . |
| 2027271A | 2/1980 | United Kingdom . |
| 1565253 | 4/1980 | United Kingdom . |

OTHER PUBLICATIONS

Lewis et al., "A Laser Interferometer Controlled X,Y Air Bearing for Direct Wafer Exposure Electron Beam Lithography," *Proc. 10th Int. Conf. on Electron and Ion Beam Science and Technology*, p. 477 (1982).

Fox, "Planar Vacuum Seal for Isolating an Air Bearing," U.S. Ser. No. 107,207, filed Dec. 16, 1979 (Corresponding PCT Appl. No. US80/01718, published Jul. 8, 1982).

*Primary Examiner*—Alfred E. Smith
*Assistant Examiner*—Jack I. Berman
*Attorney, Agent, or Firm*—Stanley Z. Cole; William R. McClellan

[57] ABSTRACT

Apparatus for positioning a semiconductor wafer with respect to a localized vacuum envelope so as to maintain a prescribed gap between the tip of the vacuum envelope and the wafer includes an x-y table, a stage assembly movable along the z-axis for holding the wafer and a z-axis actuator assembly. The z-axis actuator assembly includes a plurality of fluid-containing bellows coupled between the x-y table and the stage assembly and a hydraulic controller operated by a linear stepper motor for varying the fluid volume in each of the bellows in response to an actuator control signal so as to move the stage assembly along the z-axis. The z-axis actuator assembly can further include a flexible disk positioned in the plane of x-y movement and coupled between the x-y table and the stage assembly for preventing lateral and rotational movement of the stage assembly relative to the x-y table. The positioning apparatus is suitable for use in an electron beam lithography system.

20 Claims, 5 Drawing Figures

APPARATUS FOR POSITIONING A WORKPIECE IN A LOCALIZED VACUUM PROCESSING SYSTEM

GOVERNMENT RIGHTS

The Government has rights in this invention pursuant to Contract No. F19628-80-C-0173 awarded by the Department of the Air Force.

BACKGROUND OF THE INVENTION

This invention relates to localized vacuum processing of a workpiece and, more particularly, to apparatus for positioning a workpiece in proximity to a localized vacuum envelope so as to form a noncontacting vacuum seal as the workpiece is translated laterally with respect to the vacuum envelope.

Particle beam systems, such as ion implanters, electron beam lithography systems and ion beam lithography systems, require evacuation of the region along the path between the particle beam source and the workpiece being treated. The workpiece is introduced into the vacuum chamber either directly or through an air lock. Such systems are highly complex and expensive. In addition, the vacuum pumping time causes a reduction in overall processing speed, a factor of utmost importance in a commercial semiconductor processing environment. These problems have been alleviated by the development of localized vacuum processing as described hereinafter.

Certain particle beam processes require movement of the workpiece during processing. In electron beam lithography, microminiature patterns of extremely high accuracy are exposed on a workpiece. To achieve high accuracy, the electron beam deflection field is limited to an area much smaller than the area of the workpiece. Typically, an electron beam deflection field is a few millimeters on a side, while the workpiece, usually a semiconductor wafer or a mask plate, can be several inches in dimension. In order to expose the entire workpiece, precise positioning of the workpiece with respect to the electron beam is required. In the past, the workpiece has been positioned by a system of drive motors external to the vacuum region; and a mechanical linkage has been used to transmit the motion into the vacuum through bellows or rotary vacuum seals. Such systems have been large, complex and relatively expensive.

Apparatus for vacuum processing in a localized region on the surface of a workpiece is disclosed in pending application Ser. No. 435,179, filed Oct. 19, 1982, and assigned to the assignee of the present invention. The vacuum processing apparatus includes an envelope which defines an internal vacuum processing zone. The tip of the envelope is positioned just above the surface of the workpiece and is spaced from the workpiece by a preselected gap. The tip of the envelope, together with the workpiece, forms a noncontacting graded vacuum seal between the internal vacuum processing zone and the ambient environment. The vacuum envelope provides a vacuum zone on the surface of the workpiece which is small in comparison with the size of the workpiece.

In order to treat the entire surface of the workpiece, the workpiece is mounted on a stage which is movable laterally with respect to the tip of the envelope. To achieve rapid processing in electron beam lithography systems, stage speeds of between 1 and 10 cm/sec are typically employed. During this movement, the gap between the tip of the envelope and the workpiece must be dynamically controlled within specified limits. If the gap becomes too large, the vacuum in the vacuum zone is reduced; and processing is interrupted until the required vacuum level can again be achieved. Electron beam columns used in lithography systems must be operated in the mid to high vacuum range. Typically, inadequate space is available to provide high conductance vacuum pumping. In such cases, the gap must be relatively small. When high conductance vacuum pumping can be provided or lower pressure can be tolerated by the process, a larger gap is permitted. Conversely, the gap cannot become so small as to risk contact between the tip of the envelope and the workpiece. A workpiece, such as a semiconductor wafer, is extremely fragile and can be permanently damaged or broken by such contact. While semiconductor wafers are in general flat and planar, they are subject to thickness variations, surface irregularities and process induced warping, all of which can cause gap variations during the lateral movement of the wafer. Furthermore, the stage system which provides the lateral movement of the wafer with respect to the tip of the envelope is subject to certain imperfections and tolerances which can cause the gap to vary as the wafer is moved. These factors make is necessary to dynamically control the gap between the tip of the envelope and the workpiece during processing.

A charged particle beam system providing lateral movement of the workpiece during localized vacuum processing is disclosed in pending application Ser. No. 435,178, filed Oct. 19, 1982, and assigned to the assignee of the present invention. A gap control system for localized vacuum processing is disclosed in U.S. Pat. No. 4,528,451 assigned to the assignee of the present invention.

A critical component of the workpiece positioning system is the z-axis actuator apparatus which mechanically positions the workpiece, with respect to the tip of vacuum envelope in response to a control signal derived from a gap measurement. The actuator must be extremely accurate, since the gap between the workpiece and the vacuum envelope must be maintained within a few micrometers of a prescribed value. In addition, the actuator must be fast acting in order to maintain the required gap during lateral movements at speeds up to 10 cm/sec. Furthermore, the actuator apparatus must move the workpiece along a z-axis without introducing tilt or rotational movement, which would result in distortion and misplacement of the patterns written by the electron beam.

U.S. Pat. No. 4,528,451 discloses the use of piezoelectric z-axis actuators. While the disclosed apparatus provides generally satisfactory performance, piezoelectric actuators require relatively high operating voltages and require means for amplifying their relatively small mechanical movement. When the movement is amplified, the actuator force is correspondingly reduced.

It is a general object of the present invention to provide novel apparatus for positioning a planar workpiece.

It is also an object of the present invention to provide novel apparatus for positioning a workpiece with respect to a localized vacuum envelope.

It is another object of the present invention to provide apparatus for maintaining a prescribed gap between a workpiece and a localized vacuum envelope during lateral translation of the workpiece.

It is yet another object of the present invention to provide apparatus for z-axis positioning of a workpiece relative to a localized vacuum envelope without introducing unwanted lateral or rotational workpiece movement.

It is still another object of the present invention to provide apparatus for hydraulic z-axis positioning of a workpiece, with respect to a localized vacuum envelope.

SUMMARY OF THE INVENTION

According to the present invention, these and other objects and advantages are achieved in apparatus for z-axis positioning of a workpiece as the workpiece is translated laterally in an x-y plane. The apparatus comprises an x-y table adapted for x-y movement in a plane perpendicular to the z-axis and a stage assembly movable along the z-axis, with respect to the x-y table. The stage assembly includes means for retaining the workpiece in a processing position. The apparatus further comprises a z-axis actuator assembly including a plurality of expandable fluid-containing members coupled between the x-y table and the stage assembly and operative to expand and contract along the z-axis in response to variations in the volume of the fluid contained therein and means for varying the fluid volume in each of the fluid-containing members in response to an actuator control signal so as to move the stage assembly along the z-axis. The apparatus still further comprises means for sensing the z-axis position of the workpiece and for providing the actuator control signal which maintains the z-axis position of the workpiece within a prescribed range. In a preferred embodiment, the apparatus is utilized for positioning a semiconductor wafer with respect to a localized vacuum envelope so as to maintain a prescribed gap between the envelope and the wafer.

According to a feature of the invention, the apparatus further includes means for preventing lateral and rotational movement of the stage assembly relative to the x-y table, including a flexible planar member mounted parallel to the gap and coupled between the x-y table and the stage assembly. The fluid-containing members can be bellows, each of which can be controlled by a hydraulic cylinder with a bellows and a piston operated by a linear stepper motor.

BRIEF DESCRIPTION OF THE DRAWINGS

For a better understanding of the present invention, together with other and further objects, advantages and capabilities thereof, reference may be had to the accompanying drawings which are incorporated herein by reference and in which.

DETAILED DESCRIPTION OF THE INVENTION

Figure 1:
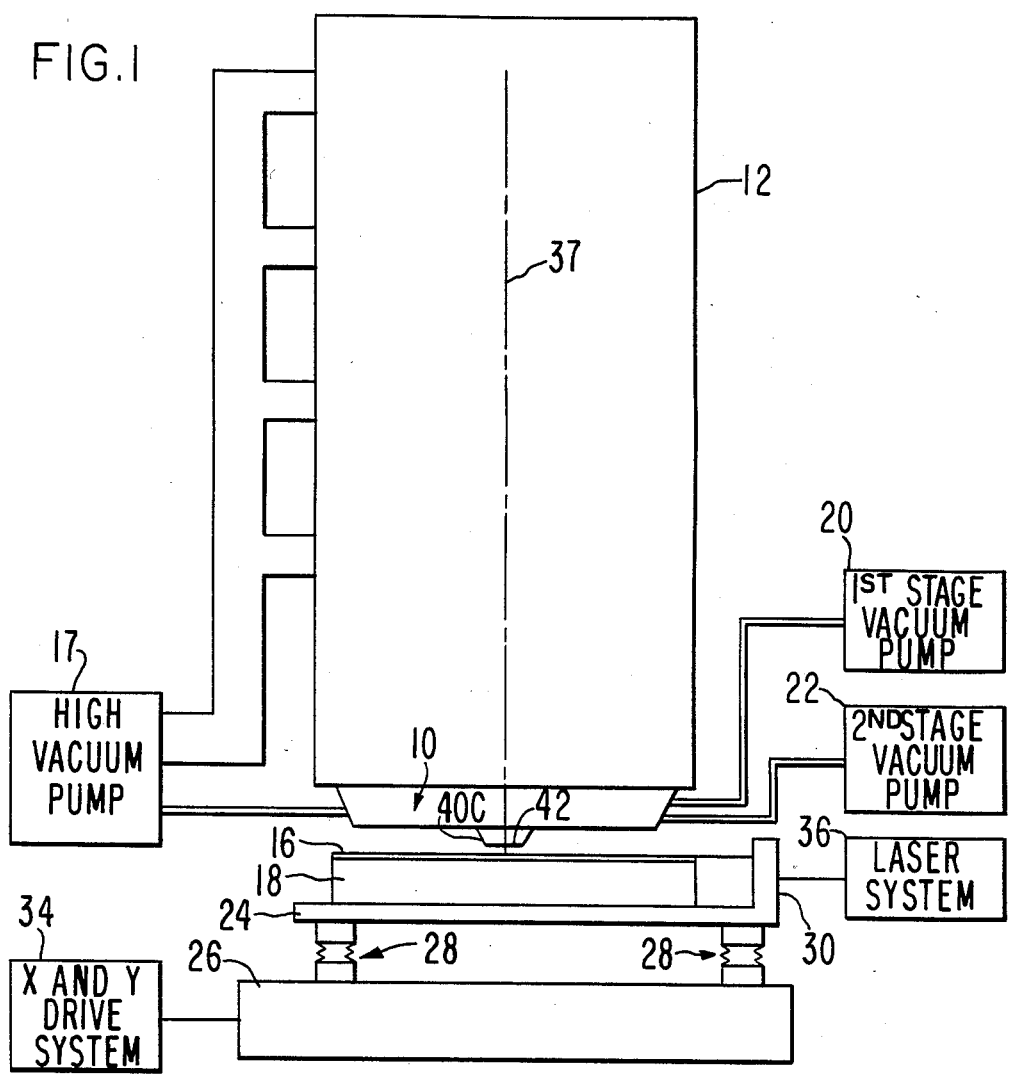
FIG. 1 is a schematic block diagram of an electron beam exposure system incorporating apparatus in accordance with the present invention.

Particle beam apparatus incorporating localized vacuum processing of a workpiece is illustrated in block diagram form in FIG. 1. An electron beam lithography system includes a localized vacuum envelope apparatus 10 mounted to the output of an electron beam column 12 which includes an electron source, demagnification optics and projection and deflection optics. The column 12 also includes illumination and shaping optics when a shaped beam is utilized. A preferred electron beam column 12 is described in U.S. Pat. No. 4,469,950. Other suitable electron beam columns are known in the art. The output of the column 12 is a finely focused electron beam 14 (FIG. 2) which passes through the envelope apparatus 10 and impinges on a workpiece such as a semiconductor wafer 16. The entire region traversed by the electron beam 14 between the electron source and the wafer 16 is maintained at high vacuum on the order of $10^{-6}$ Torr, by a high vacuum pump 17 coupled to the column 12. It will be understood by those skilled in the art that, in a practical system, the electron optical elements are located outside the vacuum region and a central tube traversed by the electron beam is maintained at high vacuum. The envelope apparatus 10 is coupled to a first stage vacuum pump 20 and to a second stage vacuum pump 22 and to the high vacuum pump 17. The wafer 16 is supported and held in position by a vacuum chuck 18 mounted on a stage 24. The stage 24 is supported above an x-y table by actuators 28 and includes mirror surfaces 30, to which the vacuum chuck 18 is rigidly coupled, for exact measurement of the x-y position of the wafer 16. Wafers are placed on the vacuum chuck 18 and removed therefrom by an automated wafer handling system (not shown). The x-y table 26 is translated in the x-y plane by an x-y drive system 34. The exact x-y position of the wafer 16 is sensed by a laser interferometer system 36 which directs optical signals at mirror surfaces 30. It will be understood that the z-axis 37 coincides generally with the path of the electron beam 14 while the x and y axes form a plane perpendicular to the z-axis 37 in which the wafer 16 is moved. The complete electron beam lithography system further includes a controller or computer and associated electronic system (not shown in FIG. 1) which controls the column 12, the drive system 34, the vacuum system and the wafer handling system and which stores pattern data and provides beam control signals.

Figure 2:
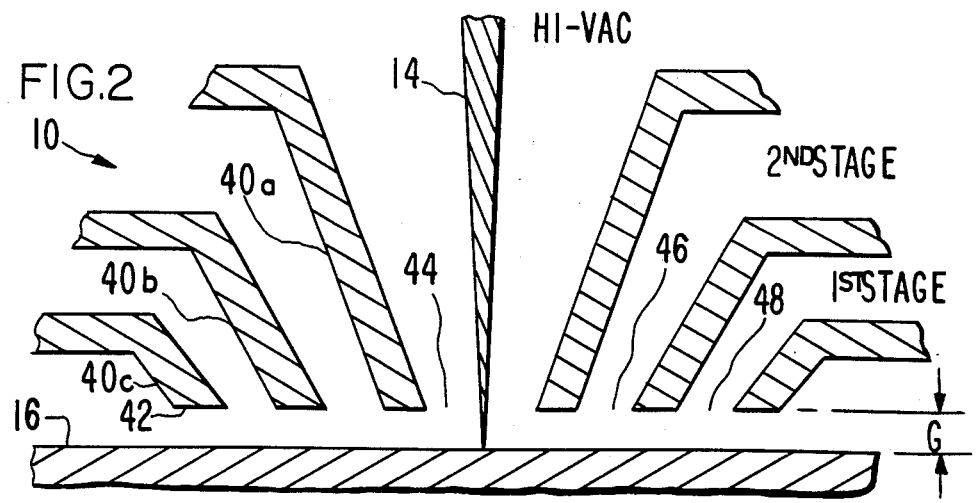
FIG. 2 is an enlarged cross-sectional view of the localized vacuum envelope apparatus illustrated in FIG. 1.

The tip of the envelope apparatus 10 and the surface of the wafer 16 are illustrated in an enlarged cross-sectional view in FIG. 2. The envelope apparatus 10 includes concentric sleeves 40a, 40b, 40c, each of which can be conical in shape and includes a tip 42 formed by coplanar positioning of the tips of sleeves 40a, 40b, 40c. The tip 42 is positioned during processing slightly above the wafer 16. A gap G, typically on the order of about 30 micrometers, is defined between the tip 42 and the surface of the wafer 16. The sleeve 40a defines a high vacuum processing zone 44. During operation, a differential pumping arrangement forms a graded vacuum seal in the gap region between the high vacuum zone 44 and the ambient environment. An annular aperture 46 concentric with zone 44 is defined between sleeves 40a and 40b; an annular aperture 48 also concentric with zone 44 is defined between sleeves 40b and 40c. The annular aperture 48 is coupled to the first stage vacuum pump 20 which reduces the pressure around the high vacuum zone 44 to a low vacuum level and produces a first vacuum zone. The annular aperture 46 is coupled to the second stage vacuum pump 22 which reduces the pressure around the high vacuum zone 44 to an intermediate vacuum level and produces a second vacuum zone. The vacuum zone 44 is coupled to the high vacuum pump 17. Depending on the pressure required in a particular process, more or fewer vacuum pumping stages can be utilized to form the graded seal. Typically, the outer diameter of the tip 42 for direct write electron beam lithography is about 10–15 mm, while the diameter of the vacuum zone 44 is about 3–5 mm. When the tip of the envelope apparatus 10 is placed in close proximity to the surface of the wafer 16, a high vacuum is maintained in the vacuum zone 44. As the wafer 16 is moved beneath the envelope apparatus 10, the electron beam 14 is scanned over a region of the wafer surface within the vacuum zone 44. Additional information on the localized envelope apparatus 10 is given in pending application Ser. No. 435,179 filed concurrently herewith and assigned to the assignee of the present invention.

Figure 3:
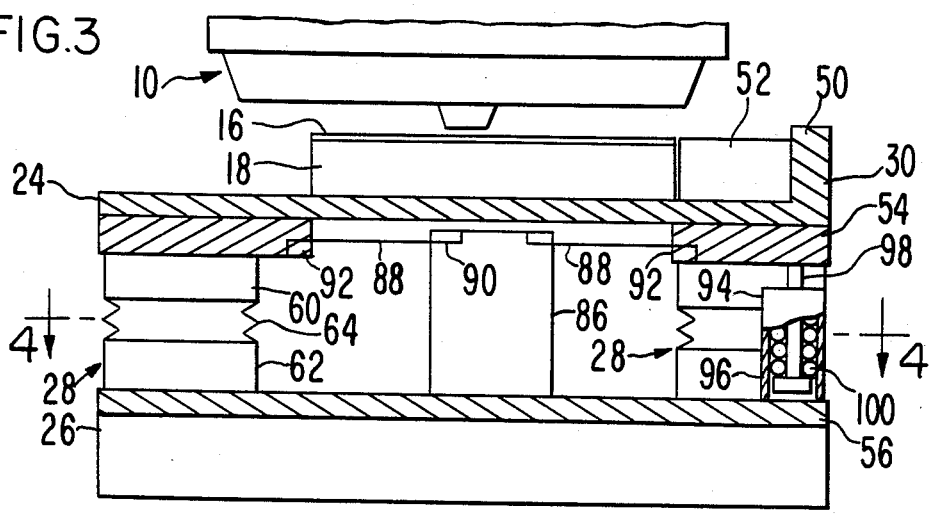
FIG. 3 is a cross-sectional view of the positioning apparatus in accordance with the present invention.
Figure 4:
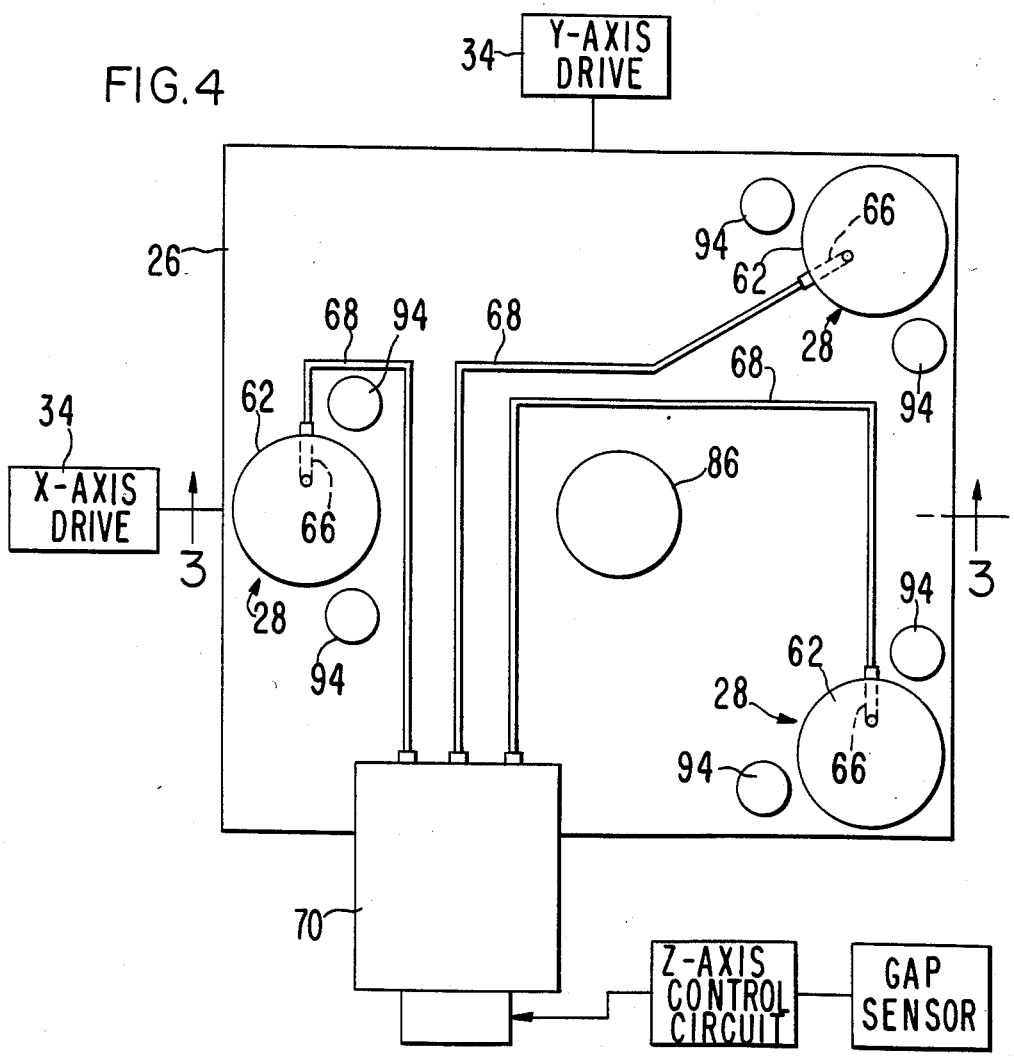
FIG. 4 is a simplified top view of the positioning apparatus shown in FIG. 3.

The apparatus for positioning the workpiece 16, with respect to the envelope apparatus 10, is shown in more detail in FIGS. 3 and 4. The vacuum chuck 18 holds the wafer 16 in a fixed position with respect to the stage 24, on which it is rigidly mounted. Vacuum chucks are generally known for holding semiconductor wafers flat and rigid and have the advantage that physical contact is made at the rear of the wafer where damage is less likely. Vacuum chuck 18 must hold the wafer 16 flat during processing and must not permit wafer movement. A suitable vacuum chuck includes a plurality of small pins surrounded by a rim which forms a vacuum seal with the wafer. The pins are coplanar with the top surface of the rim. When the volume behind the wafer is evacuated, the wafer is drawn into contact with the pins and flattened. Such a vacuum chuck is described by Saunders in "Wafer Flatness Utilizing the Pin Recess Chuck," *Solid State Tech.*, May 1982, p. 73, and in U.S. Pat. No. 4,213,698, issued July 22, 1982, Firtion et al. The stage 24 is generally in the form of a metal plate including raised edges 50 along two perpendicular sides. Precision mirrors 30 are either mounted on the raised edges 50 or preferably polished directly on the raised edges 50 for use in conjunction with the laser interferometer system 36 in sensing the x-y position of the stage 24 and the wafer 16. Also mounted on the stage 24 adjacent to the vacuum chuck 18 is an alignment pad 52 which has a top surface coplanar with the top surface of the wafer 16. During setup of the system and when wafers are being exchanged, the alignment pad 52 is positioned beneath the tip 42 of the envelope apparatus 10 in order to maintain vacuum. The alignment pad 52 typically includes fiducial marks for measurement and adjustment of the electron beam prior to exposure of the wafer 16. The stage 24 is mounted to a plate 54 which serves as an upper connecting plate for the elements of the z-axis actuator system, as described hereinafter.

A plate 56, mounted on the top surface of the x-y table 26, serves as a lower connecting plate for the elements of the z-axis actuator system. The x-y table 26 supports the stage 24 through the z-axis actuator system and is driven in the x-y plane by the drive system 34. The x-y movement must be planar to the greatest extent possible; that is, free of z-axis variations and free of vibration. Drive system 34 can be any suitable, highly precise x-y positioning system. A suitable drive system 34 employs linear motors or translators, as described in pending application Ser. No. 435,178. See, for example, B. A. Sawyer, "Magnetic Positioning Device," U.S. Pat. No. Re. 27,289 and J. Dunfield et al, "Sawyer Principal Linear Motor Positions Without Feedback," *Power Transmission Design*, p. 72, June 1974. Another suitable drive system 34 employs x and y drive motors coupled to the x-y table 26 through a screw drive, as is known in the art. Since the x-y table 26 is not in vacuum, no bellows or other vacuum interface is required. The lateral position of the stage 24 is precisely sensed by the laser interferometer system 36 which directs laser beams at perpendicular mirrors 30. The output signals from the laser interferometer system 36 are fed to a system controller, which typically includes a computer. The system controller monitors the position of the stage 24 and sends control signals to the drive system 34, which continuously positions the wafer 16 for electron beam exposure. The use of laser interferometers to monitor the x-y position of a movable stage is disclosed in U.S. Pat. No. 4,063,103, issued Dec. 13, 1977, to Sumi.

As shown in FIGS. 3 and 4, a plurality of z-axis actuators 28, typically three in number, are coupled between the plate 54 and the plate 56. Each of the actuators 28 comprises an upper support block 60 mounted on the plate 54 and a lower support block 62 mounted on the plate 56 with a flexible bellows 64 coupled between the support blocks 60, 62. The bellows 64 can have only a few convolutions, since the required z-axis travel is small, typically, on the order of 0.015 inch. The interior region of each of the bellows 64 communicates through a passage 66 in the lower support block 62 and a conduit 68 to a hydraulic controller 70. The interior of the bellows 64, the passage 66 and the conduit 68 are filled with a relatively incompressible hydraulic fluid such as oil. In the case of a charged particle beam, a perfluoropolyether fluid is the preferred hydraulic fluid. The bellows 64, in response to variations in the volume of the fluid contained therein, expand and contract causing the stage 24 to move up or down along the z-axis.

Figure 5:
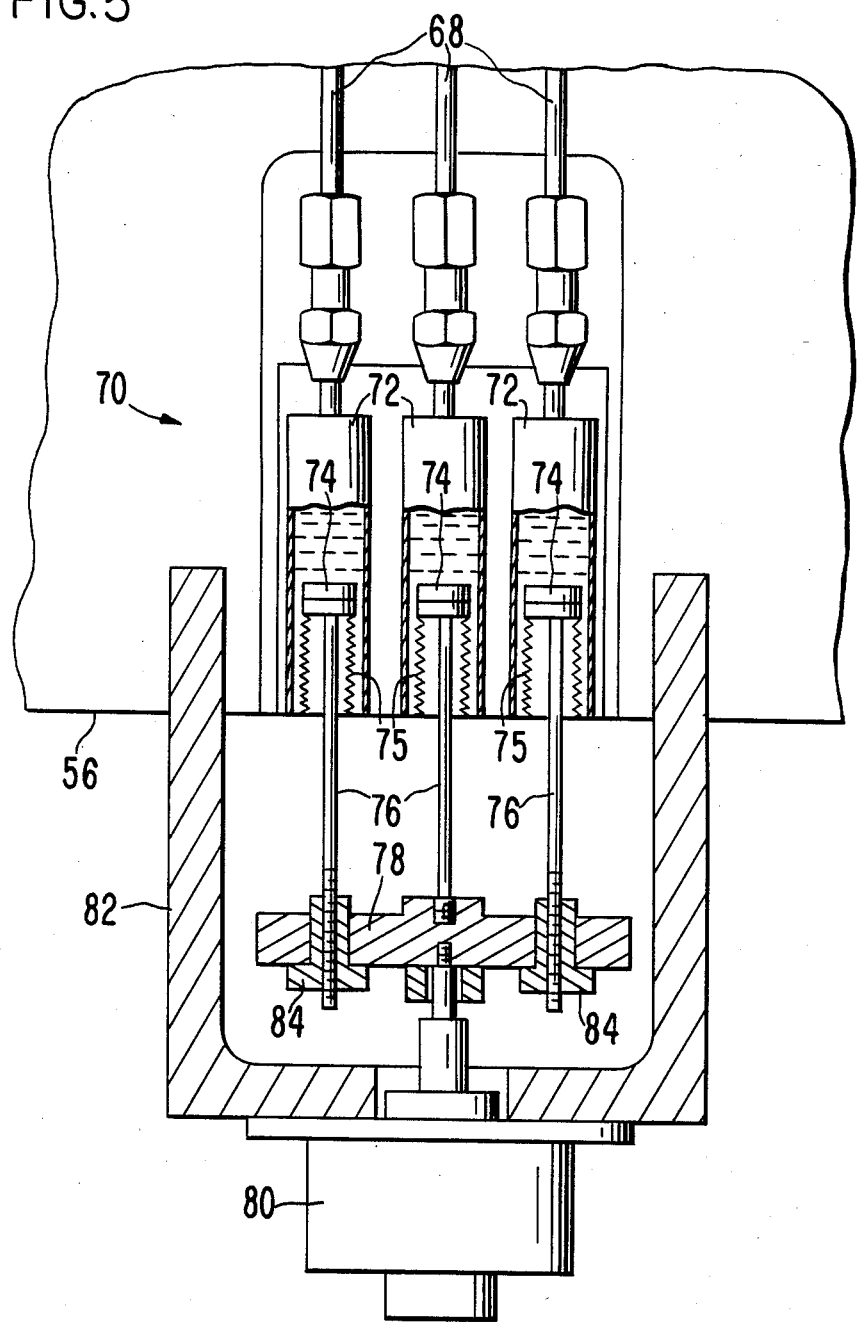
FIG. 5 illustrates the hydraulic controller portion of the positioning apparatus in accordance with the present invention.

The hydraulic controller 70 is illustrated in FIG. 5. Each of the conduits 68 from the actuators 28 is coupled to a hydraulic cylinder 72. Each of the hydraulic cylinders 72 comprises a fluid-containing cylinder, a piston 74 and a bellows 75. The use of the bellows 75 reduces friction and provides a sealed hydraulic system in which the risk of hydraulic fluid leaks is reduced. Alternatively, a conventional piston can be utilized without a bellows. The piston 74 in each of the hydraulic cylinders 72 is coupled by a connecting rod 76 to a junction block 78. Also coupled to the junction block 78 is the output shaft of a linear stepper motor 80 which is mounted by a suitable frame 82 to the plate 56. A control signal energizes the motor 80 and causes the junction block 78 to move in or out. The connecting rods 76 are actuated in parallel and cause variations in fluid volume in the cylinders 72 which, in turn, cause corresponding variations in the fluid volume in the bellows 64 and move the stage 24 up or down along the z-axis. The junction block 78 is provided with adjustment collars 84, which provide independent adjustment of the height of the actuators 28. This permits the stage 24 to be initially brought into parallel alignment with the tip 42 of the vacuum envelope apparatus 10 and the plane of x-y motion. Subsequently, during operation of the system, the actuators 28 are operated in parallel so as to maintain the parallel alignment between the vacuum envelope apparatus 10 and the workpiece 16. It will be understood that the junction block 78 can be actuated by any suitable means, such as by a conventional rotary motor and a rotary-to-linear converter or by another type of linear actuator. Also, the actuation means can be remotely located, if necessary.

Referring again to FIG. 3, the positioning apparatus is provided with means for preventing lateral or rotational movement of the stage 24 relative to the x-y table 26. A post 86 is attached rigidly to the plate 56 and extends upwardly toward the stage 24. A flexible disk 88, typically a thin sheet of spring-type metal, is mounted in the x-y plane between the plate 54 and the post 86. The post 86 is provided with a circular groove which mates with a retaining ring 90 for securing the flexible disk 88 to the post 86. Similarly, the plate 54 is provided with a circular groove which mates with a retaining ring 92 for securing the flexible disk 88 to the plate 54. The flexible disk 88 permits a small amount of movement of the stage 24 relative to the x-y table 26 along the z-axis. However, lateral movement in the x-y plane and rotational movement of the stage 24 relative to the x-y table 26 are prevented.

With reference to FIGS. 3 and 4, the positioning apparatus is provided with a plurality of spring assemblies 94 coupled between the plate 54 and the plate 56 for preloading the z-axis actuator system downwardly toward the x-y table 26. The detail of a spring assembly 94 is shown in cutaway view in FIG. 3. A spring 100 is in the compressed state and bears against a cup member 96 and a flanged pin 98, thereby preloading the z-axis actuator system downwardly toward the x-y table 26. The purpose of the spring assemblies 94 is to exert a force which offsets the upward force exerted by the vacuum envelope apparatus upon the wafer 16 and to preload the hydraulic system.

The use of the plates 54, 56 for mounting of the actuators 28, the spring assemblies 94, the post 86 and the flexible disk 88 prevents stresses from being transmitted to the stage 24. Such stresses could potentially distort the stage 24 and cause errors in the x-y wafer position measurement which relies on rigid coupling between the wafer 16 and the mirrors 30. When these stresses can be tolerated, the plates 54, 56 can be eliminated and the elements of the z-axis actuator system can be coupled directly to the x-y table 26 and the stage 24.

To maintain the dimension of the gap g within prescribed limits, a gap sensor and a control circuit are required. The gap sensor senses the distance between the tip of the vacuum envelope apparatus 10 and the wafer 16 and provides a signal representative of the gap dimension. The control circuit responds to the gap sense signal and determines whether or not the actual gap is within the prescribed limits and sends the necessary control signals to the linear stepper motor 80 to vary the gap dimension. In a preferred embodiment, a vacuum gauge coupled to the second stage of the vacuum envelope apparatus is used as a gap sensor. The pressure in the second stage of the envelope apparatus 10 is directly related to the gap dimension. The advantage of using a vacuum gauge for gap measurement is that the gap is measured in an annular ring directly adjacent to the vacuum zone 44, the point at which the gap measurement is important. A suitable vacuum gauge is a capacitive manometer vacuum gauge, such as MKS Instruments, Inc., Part No. 222BHS-A-0.5%-10. Other types of gap sensors, such as capacitive gap sensors, can also be utilized. The control circuit in its simplest form employs a comparator circuit which determines if the gap sensor output is within a predetermined range. Within this range, the gap dimension is acceptable and no z-axis actuation is necessary. If the gap sensor signal is outside the prescribed limit, a signal is transmitted to the linear stepper motor 80 for causing the stage 24 to move up or down and bring the gap dimension within the prescribed limits.

The positioning apparatus of the present invention has been described hereinabove as being used with a localized vacuum processing system. It will be understood by those skilled in the art that the disclosed positioning apparatus can be used in any application where a planar workpiece, such as a semiconductor wafer, is moved in an x-y plane and precise control of the z-axis position is required. Examples of such systems are optical and x-ray step-and-repeat systems in which a wafer must be precisely positioned with respect to a projection system.

While there has been shown and described what is at present considered the preferred embodiments of the invention, it will be obvious to those skilled in the art that various changes and modifications may be made therein without departing from the scope of the invention as defined by the appended claims.

We claim:

1. In a localized vacuum processing system, apparatus for positioning a workpiece with respect to a localized vacuum envelope so as to maintain a prescribed gap between said vacuum envelope and said workpiece as said workpiece is translated laterally with respect to a z-axis of said vacuum envelope, said apparatus comprising:
   an x-y table adapted for x-y movement in a plane perpendicular to said z-axis;
   a stage assembly movable along the z-axis with respect to said x-y table, said stage assembly including means for retaining said workpiece in a processing position;
   a z-axis actuator assembly including
      a plurality of expandable, fluid-containing members coupled between said x-y table and said stage assembly and operative to expand and contract along said z-axis in response to variations in the volume of fluid contained therein and
      means for varying the fluid volume in each of said fluid-containing members in response to an actuator control signal so as to move said stage assembly along said z-axis; and
   means for sensing the gap between said workpiece and said vacuum envelope and for providing said actuator control signal which maintains the dimension of said gap within a prescribed range.

2. The apparatus as defined in claim 1 wherein said fluid-containing members comprise bellows coupled between said x-y table and said stage assembly.

3. The apparatus as defined in claim 2 wherein said z-axis actuator assembly further includes means coupled between said x-y table and said stage assembly for preventing lateral and rotational movement of said stage assembly relative to said x-y table.

4. The apparatus as defined in claim 3 wherein said means for preventing lateral and rotational movement includes a flexible planar member mounted in a plane parallel to said gap and coupled between said x-y table and said stage assembly.

5. The apparatus as defined in claim 4 wherein said flexible member is coupled at its periphery to said stage assembly.

6. The apparatus as defined in claim 5 further including a post coupled at one end to the center of said flexible member and at the other end to said x-y table.

7. The apparatus as defined in claim 1 wherein said z-axis actuator assembly further includes means for preloading said stage assembly along the z-axis in a direction opposite the force exerted by said vacuum envelope.

8. The apparatus as defined in claim 7 wherein said means for preloading includes a plurality of spring means operative to preload said stage assembly in the direction of said x-y table.

9. The apparatus as defined in claim 1 wherein said means for varying the fluid volume in said fluid-containing members includes a linear actuator and means for converting linear motion of said linear actuator to volume variations in each of said fluid-containing members.

10. The apparatus as defined in claim 9 wherein said linear actuator includes a linear stepper motor.

11. The apparatus as defined in claim 9 wherein said means for converting linear motion includes a hydraulic cylinder coupled to each of said fluid-containing members and a piston for varying the fluid volume in said cylinders.

12. The apparatus as defined in claim 11 wherein said piston is coupled to said cylinder by a bellows.

13. The apparatus as defined in claim 11 wherein each of said hydraulic cylinders is individually adjustable to permit leveling and z-axis adjustment of said stage assembly.

14. The apparatus as defined in claim 1 wherein said stage assembly includes a polished surface in the x-z plane and a polished surface in the y-z plane for use in monitoring the x-y position of said workpiece.

15. The apparatus as defined in claim 1 wherein said means for retaining said workpieces includes a vacuum chuck.

16. The apparatus as defined in claim 1 wherein said stage assembly is coupled through a connecting plate to said z-axis actuator assembly to prevent stresses from being applied to said stage assembly by said z-axis actuator assembly.

17. The apparatus as defined in claim 1 wherein said workpiece is a semiconductor wafer and said localized vacuum envelope is attached to an electron beam lithography system.

18. Apparatus for z-axis positioning of a planar workpiece as said workpiece is translated laterally in an x-y plane, said apparatus comprising:
   an x-y table adapted for x-y movement in a plane perpendicular to said z-axis;
   a stage assembly movable along the z-axis with respect to said x-y table, said stage assembly including means for retaining said workpiece in a processing position;
   a z-axis actuator assembly including
      a plurality of expandible, fluid-containing members coupled between said x-y table and said stage assembly and operative to expand and contract along said z-axis in response to variations in the volume of fluid contained therein and
      means for varying the fluid volume in each of said fluid-containing members in response to an actuator control signal so as to move said stage assembly along said z-axis; and
   means for sensing the z-axis position of said workpiece and for providing said actuator control signal which maintains the z-axis position of said workpiece within a prescribed range.

19. In a localized vacuum processing system, apparatus for positioning a workpiece with respect to a localized vacuum envelope so as to maintain a prescribed gap between said vacuum envelope and said workpiece as said workpiece is translated laterally with respect to a z-axis of said vacuum envelope, said apparatus comprising:
   an x-y table adapted for x-y movement in a plane perpendicular to said z-axis;
   a stage assembly including means for retaining said workpiece in a processing position;
   interface means for moving said stage assembly along said z-axis relative to said x-y table and for limiting undesired movement of said workpiece relative to said x-y table, comprising
      an upper connecting plate attached to a bottom surface of said stage assembly,
      a lower connecting plate attached to a top surface of said x-y table,
      a plurality of z-axis actuators coupled between said upper connecting plate and said lower connecting plate and operative to move said stage assembly along said z-axis in response to an actuator control signal, and
      means for preventing lateral and rotational movement of said stage assembly relative to said x-y table including a flexible planar member mounted in a plane parallel to said gap and coupled at its periphery to said upper connecting plate, and a post coupled at one end to the center of said flexible member and at the other end to said lower connecting plate; and
   means for sensing the gap between said workpiece and said vacuum envelope and for providing said actuator control signal such that the dimension of said gap is maintained within a prescribed range.

20. The apparatus as defined in claim 19 wherein said interface means further includes means for preloading said stage assembly along the z-axis in a direction opposite the force exerted by said vacuum envelope.

* * * * *